(12) United States Patent
Ahn et al.

(10) Patent No.: US 6,441,479 B1
(45) Date of Patent: Aug. 27, 2002

(54) SYSTEM-ON-A-CHIP WITH MULTI-LAYERED METALLIZED THROUGH-HOLE INTERCONNECTION

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/517,318

(22) Filed: Mar. 2, 2000

(51) Int. Cl.$^7$ .............................................. H01L 23/12
(52) U.S. Cl. ....................... 257/700; 257/758; 257/759; 257/774; 257/778; 361/719; 361/748; 361/777; 174/262; 174/265; 174/266
(58) Field of Search ................................. 257/700, 701, 257/758, 773, 774, 698, 702, 759, 762, 765, 778, 621; 74/262, 265, 266; 361/719, 720, 748, 763, 777

(56) References Cited

U.S. PATENT DOCUMENTS

| | | | | |
|---|---|---|---|---|
| 3,602,635 A | * | 8/1971 | Romankiw | 174/68.5 |
| 3,673,680 A | * | 7/1972 | Tanaka et al. | 29/626 |
| 3,934,335 A | * | 1/1976 | Nelson | 29/625 |
| 4,188,415 A | * | 2/1980 | Takahashi et al. | 427/97 |
| 4,303,715 A | * | 12/1981 | Chang | 428/137 |
| 5,153,986 A | * | 10/1992 | Brauer et al. | 29/846 |
| 5,502,893 A | * | 4/1996 | Endoh et al. | 29/852 |
| 5,557,142 A | * | 9/1996 | Gilmore et al. | 257/659 |
| 5,587,885 A | * | 12/1996 | Swamy | 361/777 |

FOREIGN PATENT DOCUMENTS

JP          5-144221      *  6/1993

OTHER PUBLICATIONS

Carsten Christensen et al, "Wafer Through–Hole Interconnections with High Vertical Wiring Densities," IEEE Transactions on Components . . . , Part A, vol. 19, No. 4, Dec. 1996; pp. 516–522.

Michael Gribbons et al., "Finite–Difference Time–Domain Analysis of Pulse Propagation in Multichip Module Interconnects," IEEE Transactions of Components . . . vol. 16, No. 5, 1993; pp. 490497.

R. Downing et al., "Decoupling Capacitor Effects on Switching Noise," IEEE Transactions of Components . . . , vol. 16, No. 5, 1993 pp. 484–489.

T. Mimura et al., "System Module: A New Chip–on–Chip Module Technology," Semiconductor Research Center, Matsushita Electrical Industrial Co., Ltd., pp. 21.5.1–21.5.4.

R. J. Jensen, "Designing for Reliability in Harsh Environments," MCM technology, Honeywell Solid State Electronics Center 1997.

Evan E. Davidson et al, "Long Lossy Lines (L$^3$) and Their Impact Upon Large Chip Performance," IEEE Transactions . . . , Part B, vol. 20, No. 4, Nov. 1997, pp. 361–375.

* cited by examiner

Primary Examiner—David L. Talbott
Assistant Examiner—Alonzo Chambliss
(74) Attorney, Agent, or Firm—Dickstein Shapiro Morin & Oshinsky LLP (57) ABSTRACT

The present invention is directed to a high-performance system on a clip which uses multi-layer wiring/insulation through-hole interconnections to provide short wiring and controlled low-impedance wiring including ground planes and power supply distribution planes between chips.

85 Claims, 9 Drawing Sheets

IMTERPOSER OR MULTI-
CHIP MODULE (MCM)

SYSTEM-ON-A-CHIP WITH MULTI-LAYERED METALLIZED THROUGH-HOLE INTERCONNECTION

BACKGROUND OF THE INVENTION

I. Field of the Invention

The present invention relates generally to integrated circuit technology. More specifically, the invention relates to a multi-chip system which includes a chip carrier having a multi-layered metallized through-hole interconnection and a method of making the same.

II. Description of the Related Art

There is a growing desire for a "system on a chip" as integrated circuit technology enters the ultra large scale integration (ULSI) era. Ideally, the industry would like to build a computing system by fabricating all the necessary integrated circuits on one substrate, as compared with today's method of fabricating many chips of different functions on multiple substrates. The concept of "system on a chip" has been around since the very large scale integration (VLSI) era (early 1980s), but even today, it is very difficult to implement such a truly high-performance system on a single chip because of vastly different fabrication processes and different manufacturing yields for various logic and memory circuits. With many diverse circuits, especially with a mixture of analog and digital circuits, a low-impedance ground is also required to suppress digital noise. High-speed synchronous digital integrated circuits require large switching currents which can induce noise on the power distribution networks and ground busses due to finite resistance and inductance in these circuits. Additionally, power supply noise can have a tremendous effect due to simultaneous switching noise in CMOS integrated circuits. These problems are more severe in mixed-mode analog/digital circuits and require careful design of the power distribution systems. Thus, based on current circuit implementation, there is a need for a built-in ground plane adequate to handle and dissipate noise which is also difficult to fabricate on a single chip with other components. A buried ground plane is highly desirable to provide a flat surface to which various chips, active circuits, and passive components can be subsequently mounted.

To overcome some of these problems, a "system module" has recently been suggested in T. Mimura, et al, "System module: a new Chip-on-Chip module technology," Proc. of IEEE 1997 Custom Integrated Circuit Conf., pages 437–442, 1997. This system module consists of two chips with a first chip stacked on a second chip in a structure called Chip-on-Chip (COC) using a micro bump bonding technology (MBB). With this technology, each chip can be fabricated to perform specified functions with optimum processing conditions. Then the individual chips can be combined in a single packaged structure.

Recently, in U.S. patent application Ser. No. 09/144,307, by Ahn et al., a compact system module with built-in thermoelectric cooling is described in which a memory chip is directly mounted on a microprocessor chip. In U.S. patent application Ser. No. 09/144,290, by the same inventors of the '307 application, a scheme of high-performance packaging in which individual chips are mounted on a silicon interposer is described. In another U.S. patent application Ser. No. 09/143,729, a built-it cooling channel was introduced for efficient removal of heat generated by many chips mounted on a silicon interposer. Furthermore, a silicon interposer with built-in active devices was also recently disclosed in U.S. patent application Ser. No. 09/144,197.

Figure 1A:
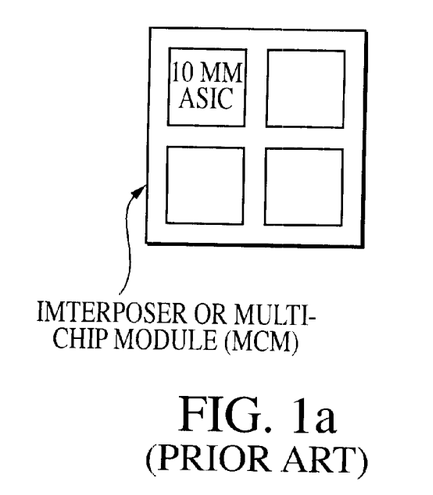
FIGS. 1(a)–1(b) illustrate an example of a prior art single microprocessor chip partitioned into four smaller ASIC chips mounted on a multi-chip module, called a die pack.
Figure 1B:
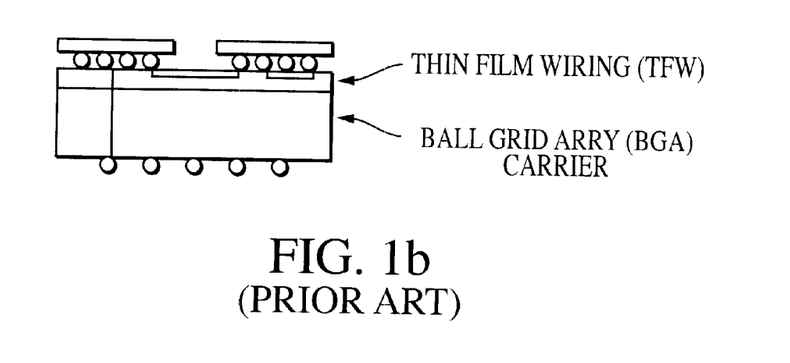

Still further, an attempt to assemble a compact system using multi-chip module technology for space-borne applications is disclosed by R. J. Jensen et al., in "Mission: MCM, Designing for Reliability in Harsh Environments," Advanced Packaging, January, 1998, p. 22–26, in which decoupling capacitors are an integral part of the system. Davidson et al. in an article entitled "Long Lossy Lines and Their Impact Upon Large chip Performance," IEEE Trans. On Component Packaging and Manufacturing, Pt. B., vol. 20., no. 4, p. 361–375, 1997, addresses key concerns in assembling many chips to a system module, namely, the length and resistance of the interconnect lines. Davidson, cites an example of a single microprocessor chip partitioned into four smaller ASIC chips for higher production yield and consequently lower cost, and suggests mounting them on a single multichip module, called a die pack, such as illustrated here in FIGS. 1(a) and 1(b). With such a scheme, a long data line can be reduced to a few millimeters. Also, see U.S. patent applications Ser. Nos. 09/009,791, 09/199,442, 09/247,680, 09/258,739 and 09/255,077 for related discussions on mounting individual chips on a common carrier substrate.

While many improvements have been made in the multi-chip on a substrate technology, there still remains a need for a high performance compact system which provides controlled low-impedance wiring, including the ground and distribution plane wiring, between chips mounted on the same and opposite side of a common substrate.

SUMMARY OF THE INVENTION

The present invention is directed to an apparatus and method of making an apparatus for a high-performance system module which uses multi-layer metallized through-hole interconnections on a chip carrier substrate to provide short wiring and controlled low-impedance wiring between chips mounted on the carrier, the wiring including at least one of a ground plane and a power distribution plane.

The term "substrate" used in the following description may include any semiconductor-based structure that has an exposed silicon surface. Structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The inventive method of the present invention comprises providing a chip carrier substrate, typically formed of silicon, with a multi-layer metallized through-hole interconnection. The through-hole interconnection may be formed by: depositing a first insulating layer of silicon dioxide over a substrate; depositing a first ground plane or power supply plane layer over the silicon dioxide layer; depositing a second insulating layer over the first layer; depositing a signal line wiring layer over the second insulating layer; depositing a third insulating layer over the signal line wiring layer; depositing another (second) ground plane or power supply plane layer over the third insulating layer; and depositing a fourth insulating layer over the second ground plane or power supply layer. The carrier substrate can be used to carry and interconnect one or more chips as part of an integrated package unit.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF THE DRAWINGS

Figure 2:
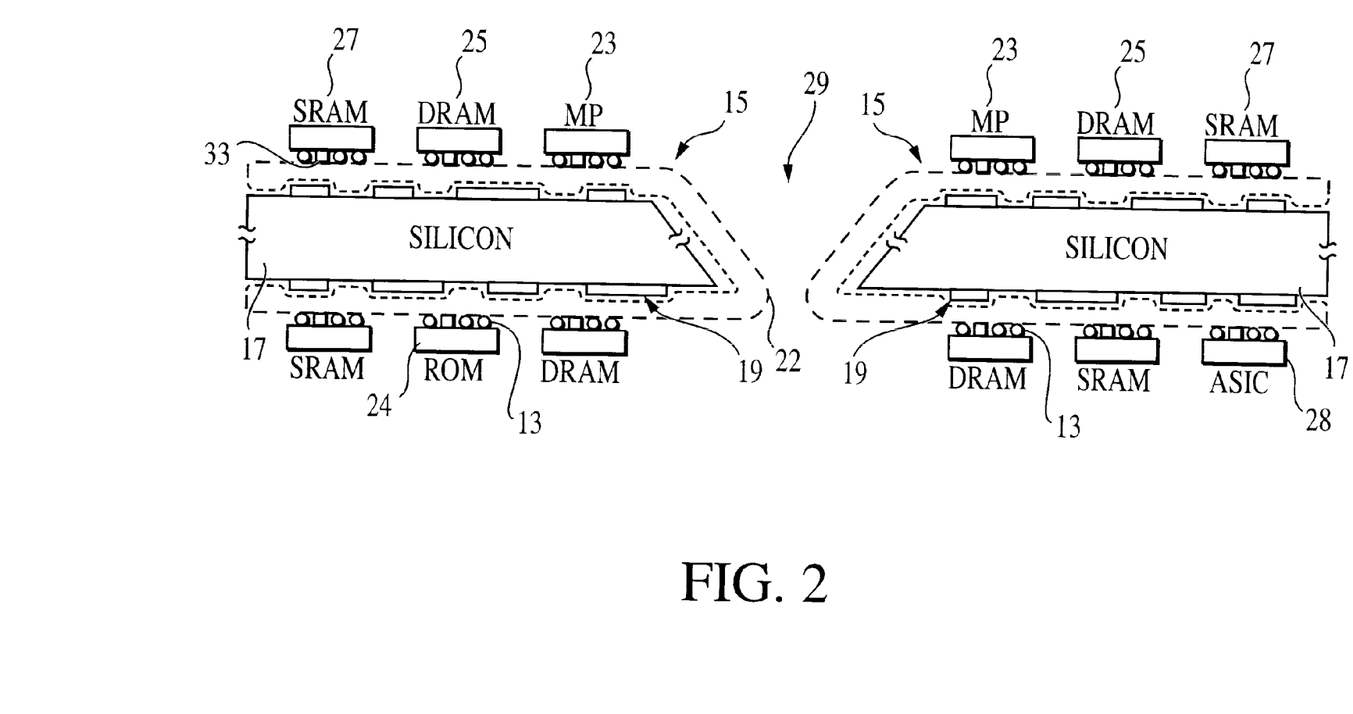
FIG. 2 illustrates a cross sectional view of a substrate having a through-hole interconnection in accordance with an exemplary embodiment of the present invention.

Referring now to the drawings, where like reference numerals designate like elements, there is shown in FIG. 2 a chip carrier system in accordance with an exemplary embodiment of the present invention. It includes a chip carrier formed as a substrate 17, e.g., a silicon substrate, on which passive or active circuit components 19, such as resistors, capacitors, inductors, transistors, etc., can be formed, which is covered by a multi-layer wiring/insulation layer 15 (described in greater detail below), and on which a plurality of circuit chips are mounted. As illustrated in FIG. 2, the circuit chips may include one or more of a microprocessor chip 23, DRAM chip 25, SRAM chip 27, ROM chip 24, ASIC chip 28, or other chips which are mounted to the multi-layer wiring/insulation layer 15 through a Ball Grid Array 13. The chip carrier is also provided with one or more through-holes 29 through which the multi-layer wiring/insulation layer 15 passes to make electrical connection between chips mounted on opposite sides of the substrate 17. For simplicity, only one through-hole 29 is shown, but it should be understood that any number may be provided. Details of through-hole fabrication for a silicon substrate were given recently in C. Christensen, et al., "Wafer through-Hole Interconnections with High Vertical Wiring Densities," IEEE Trans. On Components, Packing and Manufacturing Technology, Pt. A, vol. 19, no. 4, p. 516–522, 1996. Accordingly, a detailed description of how to form a through hole in substrate 17 will not be repeated herein.

Figure 3:
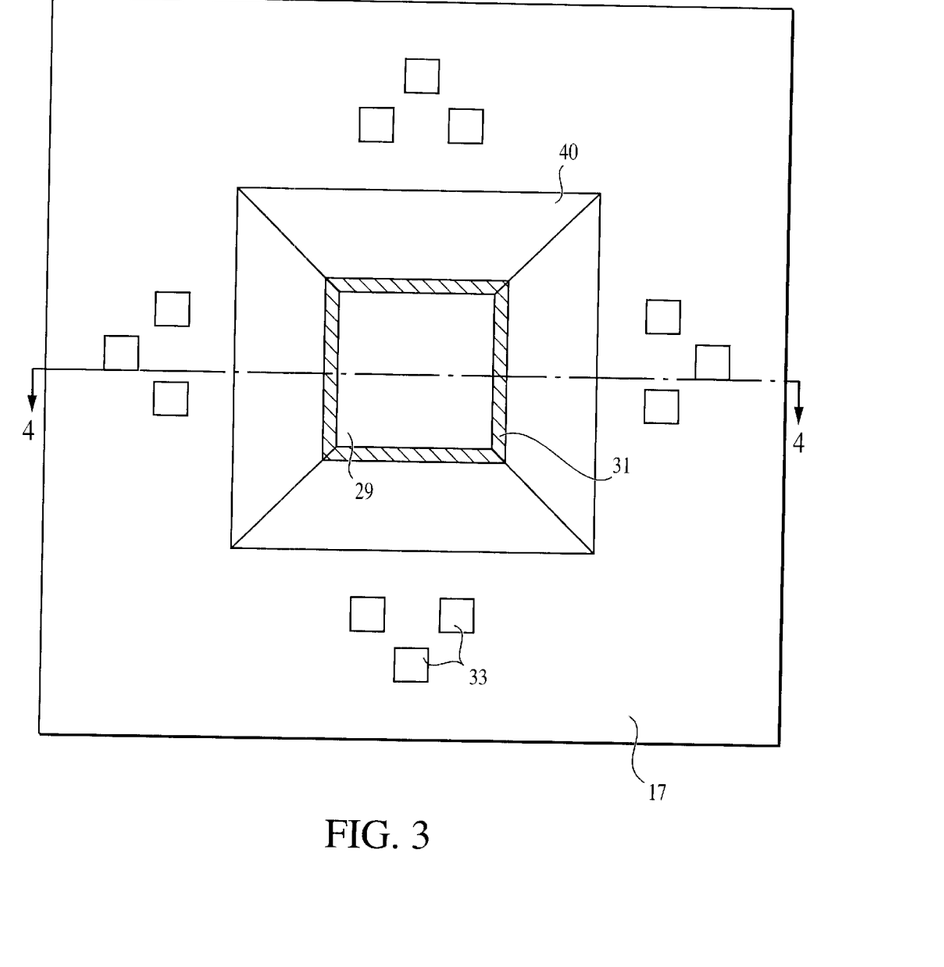
FIG. 3 is schematic drawing of a through-hole interconnection, top view in accordance with an exemplary embodiment of the present invention.
Figure 4:
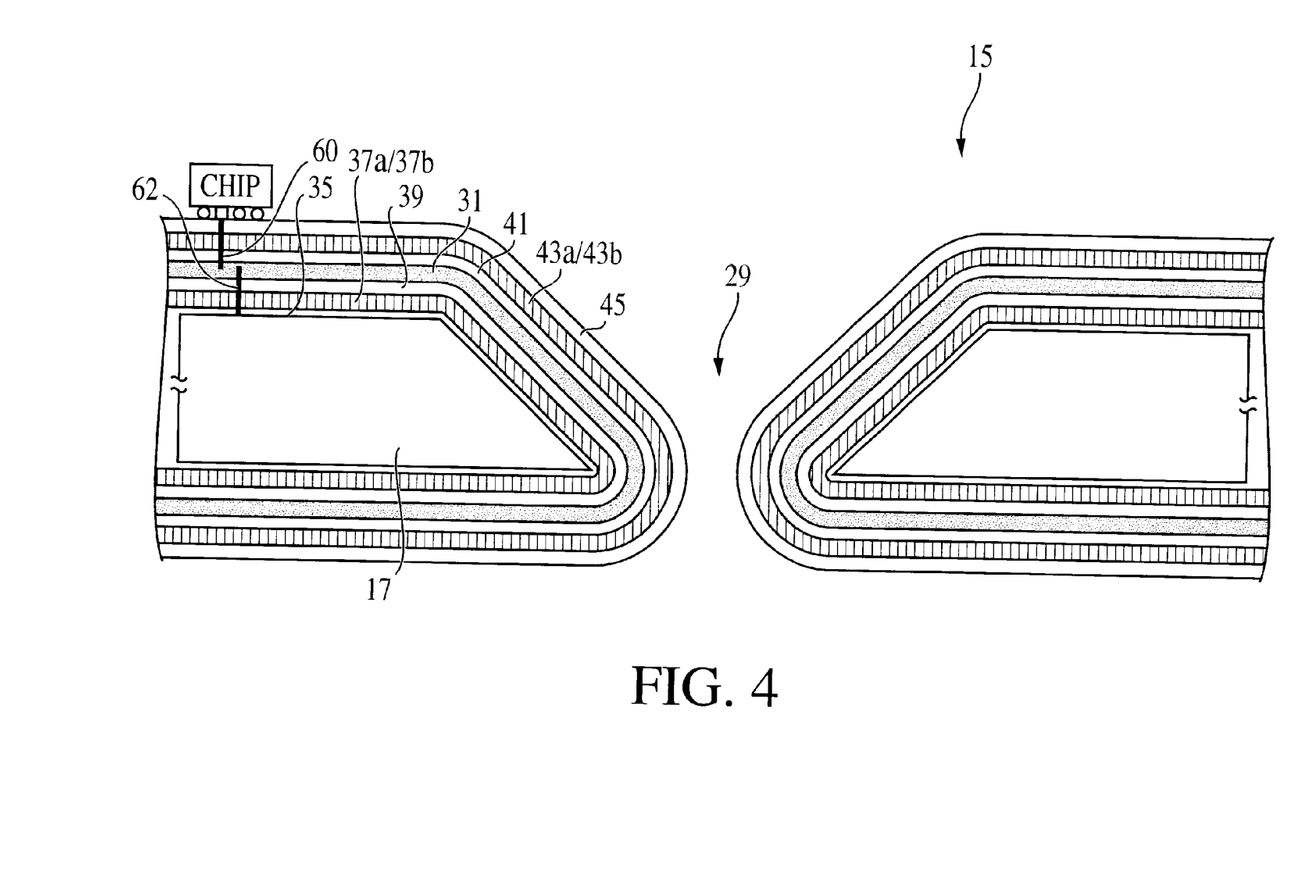
FIG. 4 is a schematic drawing of a through-hole interconnection cross sectional view along line 4—4 shown in FIG. 3.

FIG. 3 is a top view of a through-hole 29 of FIG. 2 with upper layers removed to show the signal line wiring layer 31, which pass through the through-hole 29 and associated bond pads 33 which are connected to the signal line wiring layer 31 through interconnect wiring 60 (FIG. 4). A similar signal line wiring layer 31 and associated bond pads 33 are provided on the opposite side of the substrate 17. The through-hole may be a hollowed rectangle, circle, or any other geometric shape. The chips, supported by substrate 17, are interconnected to input/output, ground and power terminals by virtue of their mounting on bond pads 33. The through-hole 29 on the top surface illustrated in FIG. 3 has sloping sidewalls 40, as also illustrated in FIG. 2. For simplicity, only 12 bond pads 33 are shown, but it should be appreciated that the number of bond pads 33 and associated leads from the signal line wiring layer 31 passing through the through-hole 29 may be larger or smaller. Typically the through-hole 29 size is 1 mm square at its smallest opening dimension 22 (FIG. 2).

FIG. 4 is a cross sectional view along line 4—4 of FIG. 3 illustrating the detailed multi-layer wiring/insulation layer 15. The multi-layer 15 is formed on the substrate 17, which may also have active and/or passive components 19 formed thereon. The multi-layer structure includes a first insulating layer 35, e.g., a silicon dioxide layer, formed as a continuous layer over both sides of substrate 17 and in the through-hole 29, a first conductive ground plane layer 37a or alternatively a conductive power supply distribution plane layer 37b formed as a continuous layer over the first insulating layer 35, a second insulating layer 39 formed as a continuous layer over the layer 37a or 37b, a signal line wiring layer 31 formed as a wiring pattern over the second insulating layer 39, a third insulating layer 41 formed as a continuous layer over the signal line wiring layer 31, another ground plane layer 43a or alternatively another conductive power supply distribution plane layer 43b formed as a continuous layer over the third insulating layer 41, and a fourth insulating layer 45 formed as a continuous layer over layer 43a or 43b.

The signal line wiring layer 31 is electrically connected to interconnect wiring 60, 62. As noted, the interconnect wiring 60 electrically connects the signal lines of wiring layer 31 with bond pads 33. The interconnect wiring 62 electrically connects the active and/or passive structures formed on substrate 17 to the signal wiring layer 31. The bond pads 33 provide locations on which one or more of the chips 23, 24, 25, 27 are mounted by for example, the Ball Grid Array technique, thereby electrically connecting the active and/or passive components fabricated on the substrate 17 to one or more of the chips 23, 24, 25, 27 through wiring layer 31.

The chip carrier system illustrated in FIGS. 2–4 contains short controlled impedance wiring paths between the chips mounted on both sides of substrate 17 through the multi-layer wiring/insulation layer 15 which passes through the through-hole 29.

Figure 5A:
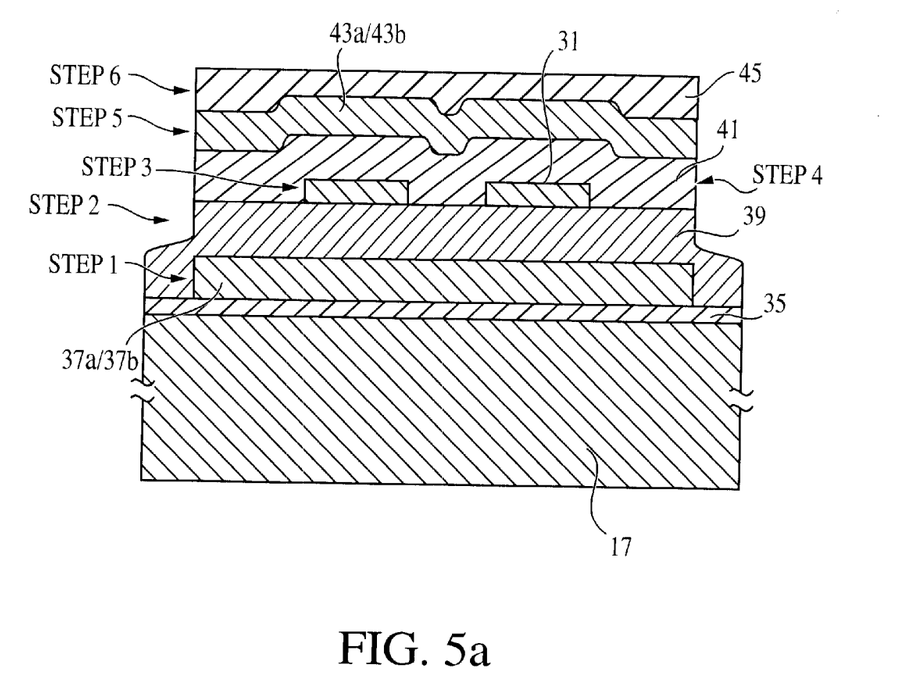
FIG. 5(a) illustrates a cross-sectional view of a controlled impedance interconnect system and fabrication sequence in accordance with an exemplary embodiment of the present invention.

FIG. 5(a) is a cross sectional view of a controlled impedance interconnect system of FIG. 4 showing the fabrication sequence. In practice, the first ground plane 37a or the power supply distribution plane 37b is first fabricated by depositing a highly conductive layer, such as copper or aluminum, by simple evaporation, sputtering or electroplating with a typical thickness of about 3 to 5 $\mu$m over a first insulating layer 35, e.g. silicon dioxide, previously deposited over the substrate 17 by, for example, CVD, typically to a thickness of about 0.1 to 0.5 $\mu$m. A second insulating layer 39 is deposited over this highly conductive layer 37a or 37b in step 2. This second insulating layer 39 preferably is silicon dioxide deposited by chemical vapor deposition (CVD) to a thickness of about 0.5 to 4 $\mu$m. Alternatively, an insulator with a lower dielectric constant, such as polyimide with $\epsilon$=3, may be deposited by spin coating followed by curing, if required by the electrical design. The next step is to fabricate the patterned signal lines 31, which are typically about 6 to 10 μm wide, by employing optical lithography of a photoresist followed by additive metallization, such as liftoff by evaporation or electroplating, both of which are low-temperature processing techniques. In step 4 a third insulating layer 41 is deposited over the signal lines 31. Once again, the third insulating layer 41 is preferably a layer of silicon dioxide deposited by CVD to a thickness of at least 50% greater than the signal line wiring layer 31 conductor thickness to ensure good step coverage at the signal line 31 conductor corners. If a lower dielectric constant is desired, a lower dielectric constant polymer, such as polyimide, can be deposited by spin coating. In step 5 a planar conductor, as another ground plane 43a or alternatively another conductive power supply distribution plane 43b, is deposited over the third insulating layer 41 to a thickness of 3 to 5 μm as was done in step 1. It may also be desirable to planarize the third insulating layer 41 to provide a flat surface so that when planar conductor 43a or 43b is formed it is substantially planar. The final step is to deposit a fourth insulating layer 45 over the planar conductor 43a or 43b.

Figure 5B:
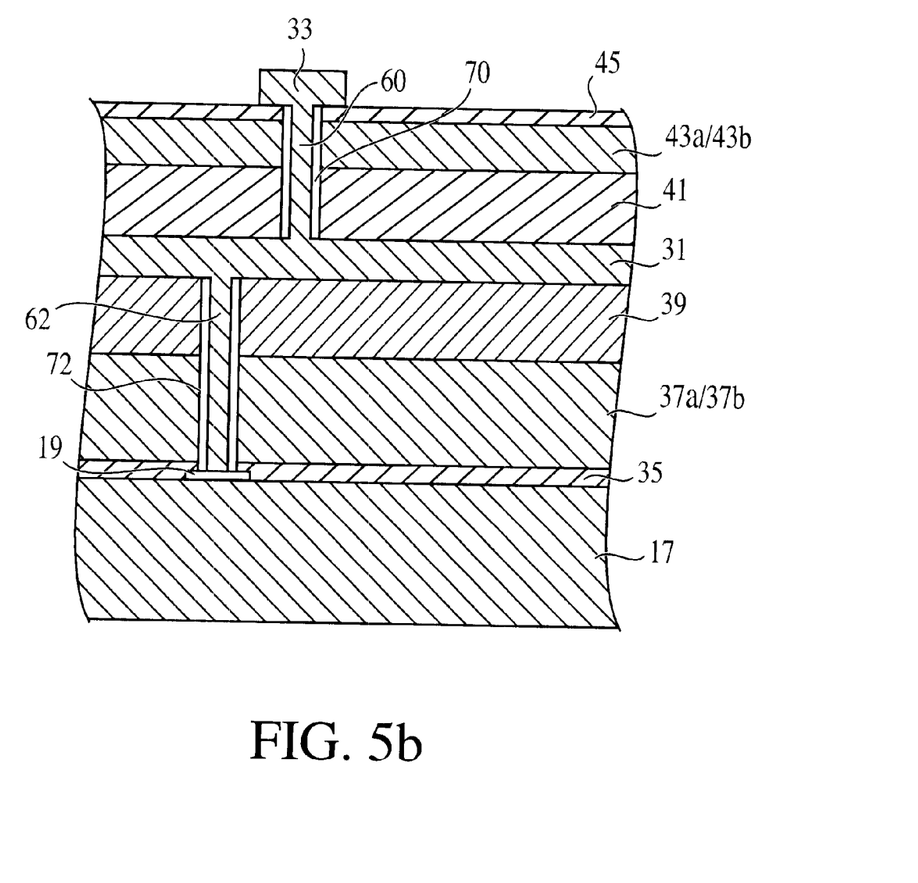
FIG. 5(b) illustrates a cross-sectional view of a controlled impedance interconnect system featuring interconnect wiring in accordance with an exemplary embodiment of the present invention.
Figure 6:
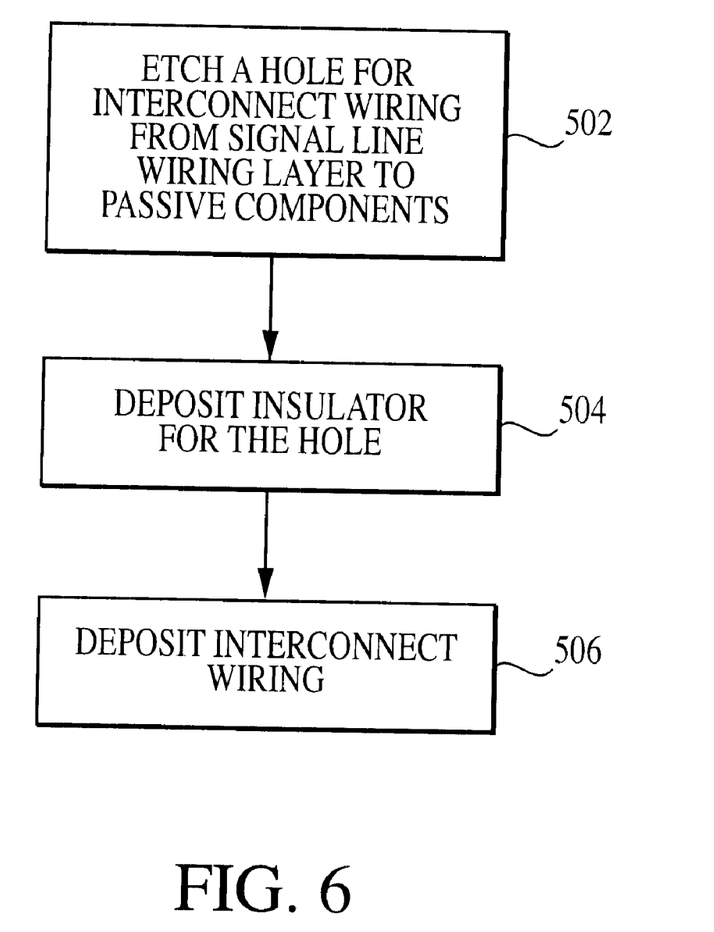
FIG. 6 illustrates the process for forming interconnect wiring between the signal Line wiring layer and substrate.
Figure 7:
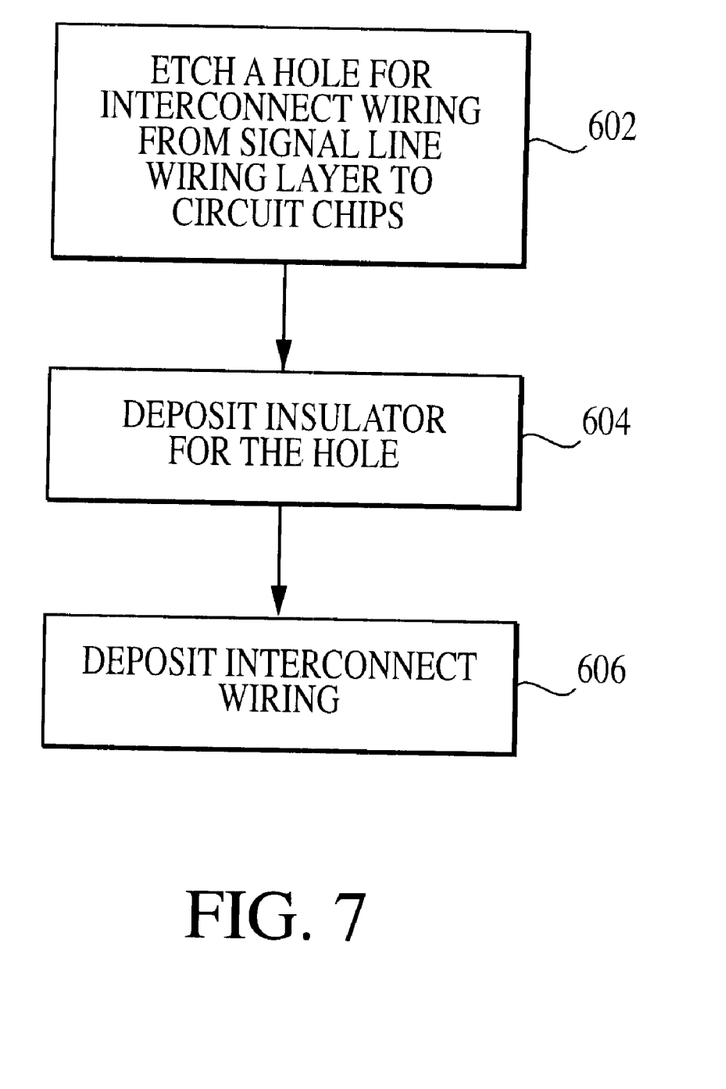
FIG. 7 illustrates the process for forming interconnect wiring between the passive components and the signal line wiring layer.

FIG. 5(b) illustrates a cross sectional view of the controlled impedance interconnect system of FIG. 5(a) with the interconnect wiring 60,62 and bond pads 33. FIGS. 6 and 7 illustrate the steps needed to provide interconnect wiring 60, 62 (FIG. 5(b)) between: (i) the active and/or passive components 19 formed on substrate 17 and the signal line wiring layer 31 and (ii) the signal line wiring layer 31 and the circuit chips 23, 24, 25, 27.

In order to get a signal from the active and/or passive components 19 to the signal lines 31, interconnect wiring 62, a signal conductor, must be fabricated. Materials and techniques for forming such interconnect wiring 62 are commonly known in the art. However, FIG. 6 provides a flow chart illustration of one exemplary technique in accordance with this invention. After step 2 of FIG. 5(a) is completed, one or more holes are etched through the second insulating layer 39, layers 37a/37b and 35 to the active and/or passive components 19. Based upon the size of interconnect wiring (conductor) 62 needed the hole may be formed by wet etching or dry etching, such as reactive ion or plasma etching, see step 502. Next, in step 504, an hole insulator 72 is deposited using CVD. This is to shield the soon to be deposited interconnect wiring 62 from the layers which are between the signal line wiring layer 31 and the substrate 17. The hole insulator 72 can be $SiO_2$, $Si_3N_4$ or other commonly known oxides. Lastly, the interconnect wiring 62 is deposited in step 506. The interconnect wiring can be aluminum or copper, for example. The interconnect wiring 62 is deposited in the insulated hole by any commonly known process, e.g. evaporation, electroplating, etc. Step 506 can occur at the same time as deposition of the signal wiring layer 31 (step 3 of FIG. 5(a)) in order to increase efficiency and attain maximum conductivity. The interconnect wiring 62 is then used to carry a signal from the active and/or passive components 19 to the signal wiring layer 31.

FIG. 7 illustrates a similar process as that described in FIG. 6 with the exception that FIG. 7 relates to depositing interconnect wiring 60 from the bond pads 33 of circuit chips 23, 24, 25, 27, 28 to the signal line wiring layer 31. For interconnect wiring 60 one or more holes are etched in step 602 and a hole insulator 70 is deposited in step 604 as in the fabrication of interconnect wiring 62. However, this process is performed after the deposition of the fourth insulating layer 45 (step 6, FIG. 5(a)). The last step, again, is to deposit the interconnect wiring 62 in step 606. When interconnect wiring 62 is deposited, the bonds pads 33 may all be fabricated in a one step metallization to increase efficiency and conductivity.

The substrate 17 with multi-layer wiring/insulation layer 15 and associated circuit chips 23, 24, 25, 27, 28 may all be encapsulated in a single integrated package unit composed of a plastic composite. In such an implementation multiple exterior pins are needed to interface the integrated package unit to a circuit board for communication with other components of a system.

Figure 8:
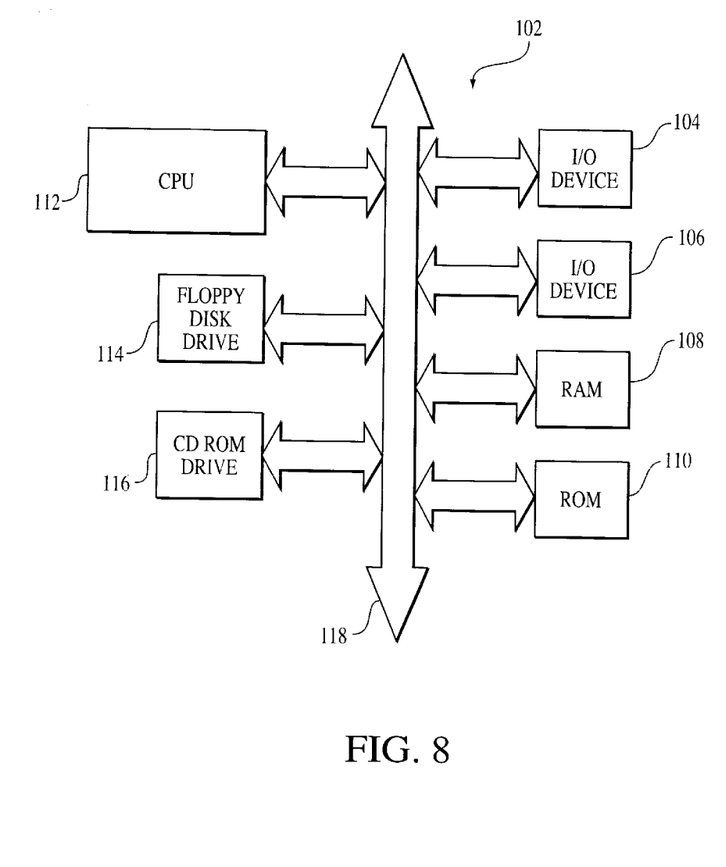
FIG. 8 illustrates a processor based system employing through-hole interconnections in accordance with an exemplary embodiment of the present invention.

FIG. 8. illustrates a processor-based system 102, including central processing unit (CPU) 112, memory devices 108, 110, input/output (I/O) devices 104, 106, floppy disk drive 114 and CD ROM drive 116. All of the above components communicate with each other over bus 118. The central processing unit (CPU) 112, and one or more of the memory devices 108, 110 are fabricated as one or more chips which can be mounted onto a chip carrier 17, as illustrated in FIG. 2, with through-hole interconnections in accordance with the present invention as described above.

As noted, the present invention provides for an apparatus and method of making the same which results in a chip carrier system with short through-hole interconnections and with a low impedance.

It is to be understood that the above description is intended to be illustrative and not restrictive. Many variations to the above-described method and structure will be readily apparent to those having ordinary skill in the art. For example, the conducting and insulting layers can be constructed of many different commonly known materials. In addition, alternative insulating and conducting layers can be formed within the multi-layer wiring/insulating layer 15 and any number of conductive and insulating layers can be used.

Accordingly, the present invention is not to be considered as limited by the specifics of the particular structures which have been described and illustrated, but is only limited by the scope of the appended claims.

What is claimed as new and desired to be protected by Letters Patent of the United States is:

1. A chip mounting system comprising:
   a substrate for mounting at least one chip, said substrate having at least one through-hole and at least one circuit component formed thereon;
   a multi-layer structure covering both sides of said substrate and passing through said at least one through-hole, said multi-layer structure comprising at least one conductive plane and a signal wiring layer, said at least one conductive plane and said signal wiring layer having an insulating layer interposed between them; and
   wherein said signal wiring layer has a first signal line in electrical communication with said at least one circuit component.

2. The chip mounting system of claim 1, wherein said conductive plane comprises a first ground plane.

3. The chip mounting system of claim 2, wherein said first ground plane is at least 3 μm thick.

4. The chip mounting system of claim 2, wherein the thickness of said first ground plane is less than or equal to 5 μm.

5. The chip mounting system of claim 1, wherein said conductive plane comprises a power supply distribution plane.

6. The chip mounting system of claim 1, wherein said conductive plane comprises a copper plane.

7. The chip mounting system of claim 1, wherein said conductive plane comprises an aluminum plane.

8. The chip mounting system of claim 1, wherein said multi-layer structure further comprises a first insulating layer provided on the side said multi-layer structure directly adjacent to said substrate.

9. The chip mounting system of claim 8, wherein said first insulating layer comprises a silicon dioxide layer.

10. The chip mounting system of claim 9, wherein the thickness of said silicon dioxide layer is 0.1 to 0.5 $\mu$m.

11. The chip mounting system of claim 8, wherein said conductive plane is deposited over said first insulating layer.

12. The chip mounting system of claim 1, wherein said insulating layer comprises a second insulating layer formed over said conductive plane.

13. The chip mounting system of claim 12, wherein said second insulating layer comprises silicon dioxide.

14. The chip mounting system of claim 12, where the thickness of said second insulating is 0.5 to 4.0 $\mu$m.

15. The chip mounting system of claim 12, wherein said second insulating layer comprises a polyimide layer.

16. The chip mounting system of claim 1, wherein said multi-layer structure further comprises a third insulating layer formed over said signal wiring layer.

17. The chip mounting system of claim 16, wherein said multi-layer structure further comprises a second conductive plane formed over said third insulating layer.

18. The chip mounting system of claim 17, wherein the thickness of said second conductive plane is 3 $\mu$m to 5 $\mu$m.

19. The chip mounting system of claim 17, wherein said second conductive plane comprises a ground plane.

20. The chip mounting system of claim 17, wherein said second conductive plane comprises a power supply distribution plane.

21. The chip mounting system of claim 17, wherein said multi-layer structure further comprises a fourth insulating layer formed over said second conductive plane.

22. The chip mounting system of claim 16, wherein said third insulating layer comprises a silicon dioxide layer.

23. The chip mounting system of claim 16, wherein said third insulating layer comprises a silicon dioxide layer.

24. The chip mounting system of claim 16, wherein said third insulating layer comprises a polyimide layer.

25. The chip mounting system of claim 1, wherein said signal wiring layer comprises a second signal line.

26. The chip mounting system of claim 25, wherein said at least one signal line is 6 to 10 $\mu$m wide.

27. The chip mounting system of claim 25, wherein said second signal line is terminated at a bond pad.

28. A chip mounting system comprising:
   a substrate for mounting at least a first chip and a second chip, said substrate having at least one through-hole;
   a multi-layer structure covering both sides of said substrate and passing through said through-hole, said multi-layer structure comprising a conductive plane and a signal wiring layer having traces terminating in bond pads on said both sides of said substrate, said conductive plane and said signal wiring layer having an insulating layer interposed between them; and
   said at least first chip and second chip mounted onto said bond pads on opposite sides of said substrate.

29. The chip mounting system of claim 28, wherein said through-hole is rectangular in shape.

30. The chip mounting system of claim 28, wherein said through-hole is circular in shape.

31. The chip mounting system of claim 28 further comprising interconnect wiring to carry a signal between said bond pads and respective traces of said signal wiring layer.

32. The chip mounting system of claim 28 further comprising interconnect wiring to carry a signal between respective traces of said signal wiring layer and active and/or passive components on the surface of said substrate.

33. The chip mounting system of claim 28, wherein said conductive plane comprises a first ground plane.

34. The chip mounting system of claim 33, wherein said first ground plane is at least 3 $\mu$m thick.

35. The chip mounting system of claim 34, wherein the thickness of said first ground plane is less than or equal to 5 $\mu$m.

36. The chip mounting system of claim 28, wherein said conductive plane comprises a power supply distribution plane.

37. The chip mounting system of claim 28, wherein said conductive plane comprises a copper plane.

38. The chip mounting system of claim 28, wherein said conductive plane comprises an aluminum plane.

39. The chip mounting system of claim 28, wherein said multi-layer structure further comprises a first insulating layer provided on the side of said multi-layer structure directly adjacent to said substrate.

40. The chip mounting system of claim 39, wherein said first insulating layer comprises a silicon dioxide layer.

41. The chip mounting system of claim 40, wherein the thickness of said silicon dioxide layer is 0.1 to 0.5 $\mu$m.

42. The chip mounting system of claim 39, wherein said conductive plane is deposited over said first insulating layer.

43. The chip mounting system of claim 28, wherein said insulating layer comprises a second insulating layer formed over said conductive plane.

44. The chip mounting system of claim 43, wherein said second insulating layer comprises silicon dioxide.

45. The chip mounting system of claim 43, where the thickness of said second insulating is 0.5 to 4.0 $\mu$m.

46. The chip mounting system of claim 43, wherein said second insulating layer comprises a polyimide layer.

47. The chip mounting system of claim 28, wherein said multi-layer structure further comprises a third insulating layer formed over said signal wiring layer.

48. The chip mounting system of claim 47, wherein said multi-layer structure further comprises a second conductive plane formed over said third insulating layer.

49. The chip mounting system of claim 48, wherein the thickness of said second conductive plane is 3 $\mu$m to 5 $\mu$m.

50. The chip mounting system of claim 48, wherein said second conductive plane comprises a ground plane.

51. The chip mounting system of claim 48, wherein said second conductive lane comprises a power supply distribution plane.

52. The chip mounting system of claim 48, wherein said multi-layer structure further comprises a fourth insulating layer formed over said second conductive plane.

53. The chip mounting system of claim 47, wherein said third insulating layer comprises a silicon dioxide layer.

54. The chip mounting system of claim 47, wherein said third insulating layer comprises a silicon dioxide layer.

55. The chip mounting system of claim 47, wherein said third insulating layer comprises a polyimide layer.

56. The chip mounting system of claim 28, wherein said signal wiring layer comprises at least one signal line.

57. The chip mounting system of claim 56, wherein said at least one signal line is terminated at a bond pad.

58. The chip mounting system of claim 56, wherein said at least one signal line is 6 of 10 $\mu$m wide.

59. An integrated circuit package comprising:
   a substrate for mounting at least one chip, said substrate having at least one through-hole;

a multi-layer structure covering both sides of said substrate and passing through said through-hole, said multi-layer structure comprising a conductive plane and a signal wiring layer, said conductive plane and said signal wiring layer having an insulating layer interposed between them, wherein said signal wiring layer has interconnect wiring extending to opposite sides of said multi-layer structure; and an integrated circuit package to encase said substrate, said multi-layer structure and at least one circuit chip.

60. The integrated circuit package of claim 59, wherein said conductive plane comprises a first ground plane.

61. The integrated circuit package of claim 60, wherein said first ground plane is at least 3 μm thick.

62. The integrated circuit package of claim 60, wherein the thickness of said first ground plane is less than or equal to 5 μm.

63. The integrated circuit package of claim 59, wherein said conductive plane comprises a power supply distribution plane.

64. The integrated circuit package of claim 59, wherein said conductive plane comprises a copper plane.

65. The integrated circuit package of claim 59, wherein said conductive plane comprises an aluminum plane.

66. The integrated circuit package of claim 59, wherein said multi-layer structure further comprises a first insulating layer provided on the side of said multi-layer structure directly adjacent to said substrate.

67. The integrated circuit package of claim 66, wherein said first insulating layer comprises a silicon dioxide layer.

68. The integrated circuit package of claim 67, wherein the thickness of said silicon dioxide layer is 0.1 to 0.5 μm.

69. The integrated circuit package of claim 66, wherein said conductive plane is deposited over said first insulating layer.

70. The integrated circuit package of claim 59, wherein said insulating layer comprises a second insulating layer formed over said conductive plane.

71. The integrated circuit package of claim 70, wherein said second insulating layer comprises silicon dioxide.

72. The integrated circuit package of claim 70, where the thickness of said second insulating is 0.5 to 4.0 μm.

73. The integrated circuit package of claim 70, wherein said second insulating layer comprises a polyimide layer.

74. The integrated circuit package of claim 59, wherein said multi-layer structure further comprises a third insulating layer formed over said signal wiring layer.

75. The integrated circuit package of claim 74, wherein said multi-layer structure further comprises a second conductive plane formed over said third insulating layer.

76. The integrated circuit package of claim 75, wherein the thickness of said second conductive plane is 3 μm to 5 μm.

77. The integrated circuit package of claim 75, wherein said second conductive plane comprises a ground plane.

78. The integrated circuit package of claim 75, wherein said second conductive plane comprises a power supply distribution plane.

79. The integrated circuit package of claim 75, wherein said multi-layer structure further comprises a fourth insulating layer formed over said second conductive plane.

80. The integrated circuit package of claim 59, wherein said signal wiring layer comprises at least one signal line.

81. The integrated circuit package of claim 74, wherein said third insulating layer comprises a silicon dioxide layer.

82. The integrated circuit package of claim 74, wherein said third insulating layer comprises a silicon dioxide layer.

83. The integrated circuit package of claim 74, wherein said third insulating layer comprises a polyimide layer.

84. The integrated circuit package of claim 80, wherein said at least one signal line is 6 to 10 μm wide.

85. The integrated circuit package of claim 80, wherein said at least one signal line is terminated at a bond pad.

* * * * *